(12) United States Patent
Kim et al.

(10) Patent No.: US 11,349,055 B2
(45) Date of Patent: May 31, 2022

(54) THERMOELECTRIC MODULE

(71) Applicant: LG CHEM, LTD., Seoul (KR)

(72) Inventors: Su Jin Kim, Daejeon (KR); Il Ha Lee, Daejeon (KR); Dong Sik Kim, Daejeon (KR); Byung Kyu Lim, Daejeon (KR); Cheol Hee Park, Daejeon (KR); Ki Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 17/306,473

(22) Filed: May 3, 2021

(65) Prior Publication Data

US 2021/0273149 A1 Sep. 2, 2021

Related U.S. Application Data

(62) Division of application No. 16/475,587, filed as application No. PCT/KR2018/006163 on May 30, 2018, now abandoned.

(30) Foreign Application Priority Data

Jun. 15, 2017 (KR) ........................ 10-2017-0076058

(51) Int. Cl.
*H01L 35/08* (2006.01)
*H01L 35/14* (2006.01)
*H01L 35/16* (2006.01)
*H01L 35/18* (2006.01)

(52) U.S. Cl.
CPC .............. *H01L 35/08* (2013.01); *H01L 35/14* (2013.01); *H01L 35/16* (2013.01); *H01L 35/18* (2013.01)

(58) Field of Classification Search
CPC ......... H01L 35/08; H01L 35/14; H01L 35/16; H01L 35/18
See application file for complete search history.

(56) References Cited

U.S. PATENT DOCUMENTS

| | | | |
|---|---|---|---|
| 6,410,971 | B1 | 6/2002 | Otey |
| 2013/0061901 | A1 | 3/2013 | Tohei et al. |
| 2013/0243036 | A1 | 9/2013 | Scervini et al. |
| 2014/0216515 | A1* | 8/2014 | Ochi .................. H01L 35/08 |
| | | | 136/205 |
| 2014/0360570 | A1 | 12/2014 | Baek et al. |
| 2015/0179912 | A1 | 6/2015 | Maeshima et al. |

(Continued)

FOREIGN PATENT DOCUMENTS

| | | | |
|---|---|---|---|
| EP | 1876656 A2 * | 1/2008 | ........... C01G 23/002 |
| JP | 2001-28462 A | 1/2001 | |

(Continued)

OTHER PUBLICATIONS

Fan et al., "Fabrication and reliability evaluation of Yb0.3Co4Sb12/ Mo—Ti/Mo—Cu/Ni thermoelectric joints", Ceramics International, 2015, vol. 41, pp. 7590-7595.

(Continued)

*Primary Examiner* — Golam Mowla
(74) *Attorney, Agent, or Firm* — Birch, Stewart, Kolasch & Birch, LLP

(57) ABSTRACT

A thermoelectric module that has excellent thermal, electric properties, can realize high joining force between thermoelectric elements and an electrode, and can maintain stable joining even at a high temperature.

8 Claims, 10 Drawing Sheets

(56) References Cited

U.S. PATENT DOCUMENTS

2016/0172569 A1    6/2016  Fujimoto et al.
2018/0033938 A1    2/2018  Lee et al.

FOREIGN PATENT DOCUMENTS

| JP | 2008-10612 A | 1/2008 |
| JP | 2011-114291 A | 6/2011 |
| JP | 2011-193013 A | 9/2011 |
| JP | 2011-249492 A | 12/2011 |
| JP | 2013-60655 A | 4/2013 |
| JP | 2013-70044 A | 4/2013 |
| JP | 2013-527600 A | 6/2013 |
| JP | 2014-236109 A | 12/2014 |
| JP | 2015-50272 A | 3/2015 |
| KR | 10-2016-0042901 A | 4/2016 |
| KR | 10-2017-0012119 A | 2/2017 |
| KR | 10-2017-0061229 A | 6/2017 |
| WO | WO 2014/199541 A1 | 12/2014 |
| WO | WO 2016/007326 A1 | 1/2016 |

OTHER PUBLICATIONS

International Search Report for PCT/KR2018/006163 dated Aug. 14, 2018.
JP 2013060655 A online machine translation, translated by "Patent Translate: Powered by EPO and Google", translated on Jan. 29, 2021.

* cited by examiner

THERMOELECTRIC MODULE

CROSS-REFERENCE TO RELATED APPLICATION(S)

This application is a Divisional of application Ser. No. 16/475,587 filed on Jul. 2, 2019, which is the U.S. National Phase of PCT/KR2018/006163, filed on May 30, 2018, which claims the benefit of Korean Patent Application No. 10-2017-0076058 filed on Jun. 15, 2017 with the Korean Intellectual Property Office, the disclosures of which are herein incorporated by reference in their entirety.

TECHNICAL FIELD

The present invention relates to a thermoelectric module that has excellent thermal, electric properties, can prevent the deformation of a thermoelectric element even under a high temperature condition, and can be stably operated.

BACKGROUND ART

If there is a temperature difference between both ends of solid material, a difference in the concentration of heat-dependent carriers (electrons or holes) is generated, which is exhibited as an electrical phenomenon of thermos-electromotive force, namely, a thermoelectric effect. The thermoelectric effect means reversible and direct energy conversion between temperature difference and electricity and voltage.

Such a thermoelectric effect may be divided into thermoelectric generation that generates electric energy, and thermoelectric cooling/heating that induces temperature difference of both ends by the supply of electricity, to the contrary.

Thermoelectric material exhibiting a thermoelectric effect, i.e., thermoelectric semiconductor has advantages in that it is environmentally-friendly and is sustainable in the processes of generation and cooling, and thus, a lot of studies thereon are being progressed. Furthermore, it can directly produce electric powder in industrial waste heat, automobile waste heat, etc., and is useful for improvement in fuel efficiency and $CO_2$ reduction, etc., and thus, there is increasing attentions on the thermoelectric material.

The basic unit of a thermoelectric module is one pair of p-n thermoelectric elements consisting of a p-type thermoelectric element (TE) where current flows by hole carriers, and an n-type thermoelectric element where current flows by electrons. And, such a thermoelectric module may include an electrode that connects between the p-type thermoelectric element and n-type thermoelectric element.

Such a thermoelectric module, although different according to the kind of thermoelectric material used, is used to convert heat energy into electric energy, generally at a temperature region of about 250° C. or more, or about 300° C. or more, and particularly, in case recently frequently used antimony-based thermoelectric material is used, the thermoelectric module is operated under a high temperature condition of about 500° C. or more.

However, under such temperature conditions, elements included in a joining layer for connecting thermoelectric elements and an electrode may be diffused toward the thermoelectric element, or oxidation or thermal deformation may be generated on the surface of the thermoelectric element, thus making the operation difficult.

Therefore, there is a demand for the development of a thermoelectric module that can be stably operated even at a high temperature of about 300° C. or more, preferably about 500° C. or more, and has excellent thermal, electric properties.

DETAILED DESCRIPTION OF THE INVENTION

Technical Problem

It is an object of the present invention to provide a thermoelectric module that has excellent thermal, electric properties, can prevent oxidation or thermal deformation of a thermoelectric element, and thus, can realize high long-term reliability.

Technical Solution

The present invention provides a thermoelectric module comprising
A) plural thermoelectric elements comprising thermoelectric semiconductor;
B) an electrode for connecting between the plural thermoelectric elements;
C) a joining layer for joining the thermoelectric element and electrode, positioned between each thermoelectric element and electrode; and
D) an anti-oxidation layer positioned between the thermoelectric element and the joining layer,
wherein the anti-oxidation layer includes one or more compounds selected from the group consisting of the following i) to iv):
i) alloy including molybdenum (Mo); and one or more metals selected from the group consisting of tungsten (W), cobalt (Co), titanium (Ti), zirconium (Zr), and tantalum (Ta),
ii) oxide of the alloy,
iii) nitride of the alloy, and
iv) oxynitride of the alloy.

Advantageous Effect

According to the present invention, a thermoelectric module that can prevent thermal diffusion of the material of a joining layer, can prevent oxidation and deformation of thermoelectric elements under a high temperature environment, and exhibits improved operation stability due to excellent adhesion of thermoelectric elements can be provided, by comprising an anti-oxidation layer having excellent thermal, electric properties between the thermoelectric elements and joining layer,

EXPLANATION OF SYMBOLS

Figure 1:
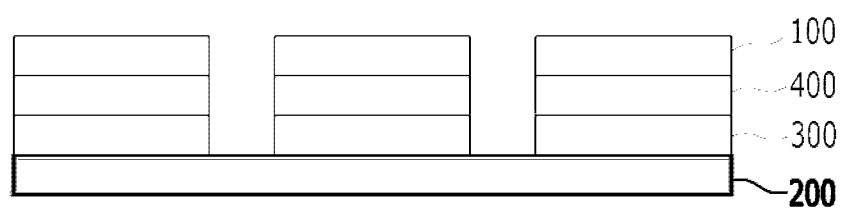
FIG. 1 is a schematic view showing the cross section of a thermoelectric module according to one embodiment of the present invention.

100: thermoelectric element
200: electrode
300: joining layer
400: anti-oxidation layer

DETAILED DESCRIPTION OF THE EMBODIMENTS

As used herein, terms "a first", "a second" and the like are used to explain various constructional elements, and they are used only to distinguish one constructional element from other constructional elements.

The terms used herein are only to explain specific embodiments, and are not intended to limit the present invention. A singular expression includes a plural expression thereof, unless it is expressly stated or obvious from the context that such is not intended. As used herein, the terms "comprise" or "have", etc. are intended to designate the existence of practiced characteristic, number, step, constructional element or combinations thereof, and they are not intended to preclude the possibility of existence or addition of one or more other characteristics, numbers, steps, constructional elements or combinations thereof.

And, in case it is stated that each constructional element is formed "on" or "above" each construction element, it means that each constructional element is formed directly on each constructional element, or that other constructional elements may be additionally formed between the layers or on the object or substrate.

Although various modifications can be made to the present invention and the present invention may have various forms, specific examples will be illustrated and explained in detail below. However, it should be understood that these are not intended to limit the present invention to specific disclosure, and that the present invention includes all the modifications, equivalents or replacements thereof without departing from the spirit and technical scope of the invention.

A thermoelectric module according to one embodiment of the present invention comprises:

A) at least a first and a second thermoelectric element, the first and second thermoelectric element comprising a thermoelectric semiconductor;

B) an electrode connecting the first and second thermoelectric elements;

C) at least a first and a second joining layer, the first joining layer positioned between the first thermoelectric element and the electrode, and the second joining layer positioned between the second thermoelectric element and the electrode; and D) at least a first and a second anti-oxidation layer, the first anti-oxidation layer positioned between the first thermoelectric element and the first joining layer, and the second anti-oxidation layer positioned between the second thermoelectric element and the second joining layer, wherein the first and second anti-oxidation layer independently comprise one or more selected from the group consisting of the following i) to iv):

i) an alloy comprising molybdenum; and one or more metal selected from the group consisting of tungsten, cobalt, titanium, zirconium, and tantalum, ii) an oxide of the alloy of i), iii) a nitride of the alloy of i), and iv) an oxynitride of the alloy of i).

In general, a module of thermoelectric conversion elements that generates electricity using a temperature difference is used under an environment having a large temperature difference between a high temperature region and a low temperature region so as to obtain high efficiency, and it is operated at a temperature region of about 200° C. to 300° C., or about 500° C. to 600° C. according to the element. Under such a temperature condition, the material of a joining layer that joins a thermoelectric element and an electrode is diffused, and is inflowed into a thermoelectric element, or an oxidation reaction occurs on the surface of a thermoelectric element, thus causing deformation of the element.

However, since the thermoelectric module according to one embodiment of the present invention has a anti-oxidation layer, even if exposed to a high temperature, high pressure environment in the joining process during the manufacture of a thermoelectric module or in the operation step after manufacture, the diffusion and inflow of the elements of the joining layer into the thermoelectric element, or oxidation or thermal deformation of the thermoelectric element under a high temperature environment may be prevented. Thus, the thermoelectric module according to one embodiment of the present invention may have excellent thermal, electric properties, and realize a stable joining force between the thermoelectric element and electrode even at a high temperature, and thus, has excellent stability.

And, since the anti-oxidation layer consisting of alloy, oxide of alloy, nitride of alloy, and/or oxynitride of alloy has high hardness due to ceramic material, it can increase mechanical stability of the element joining at the interface of the thermoelectric element and the joining layer.

FIG. 1 is a schematic view showing the cross section of the thermoelectric module according to one embodiment of the present invention. FIG. 1 is no more than one example of the present invention and the present invention is not limited thereto.

Referring to FIG. 1, the thermoelectric module according one embodiment of the present invention comprises A) plural thermoelectric elements (100) comprising thermoelectric semiconductor;

B) an electrode (200) for connecting between the plural thermoelectric elements (100);

C) a joining layer (300) for joining the thermoelectric element (100) and electrode (200), positioned between each thermoelectric element (100) and electrode (200); and D) an anti-oxidation layer (400) positioned between the thermoelectric element (100) and the joining layer (300), for preventing thermal diffusion of the material of the joining layer, and oxidation and deformation of the thermoelectric element under a high temperature environment.

Specifically, in the thermoelectric module according to one embodiment of the present invention, the anti-oxidation layer (400) may be positioned in direct contact with the thermoelectric elements, between the thermoelectric elements (100) and the joining layer (300), and on the upper/lower sides of the thermoelectric elements.

Since the anti-oxidation layer is formed between the thermoelectric elements and the joining layer, when exposed to a high temperature condition, counter diffusion of materials at the interface of the thermoelectric elements and the joining layer may be prevented, and the occurrence of an oxidation reaction due to a high temperature may be prevented on the surface of the thermoelectric element.

And, the anti-oxidation layer (400) may be formed on at least one side of the thermoelectric elements, which does not contact the joining layer, as well as between the thermoelectric elements and the joining layer. In this case, by preventing the occurrence of an oxidation reaction and deformation on the side of the thermoelectric elements at a high temperature, high temperature stability of the thermoelectric element may be further improved.

Specifically, in the thermoelectric module according to one embodiment of the present invention, the anti-oxidation layer (400) may include one or more of: i) alloy including Mo, and one or more metals selected from the group consisting of W, Co, Ti, Zr and Ta, ii) oxide of the alloy; nitride of the alloy; and iv) oxynitride of the alloy.

Mo may exhibit more excellent effect for heat diffusion during the formation of an anti-oxidation layer, compared to other transition metals, and thus, can improve the performance of a thermoelectric element.

Since the anti-oxidation layer in the thermoelectric module according to one embodiment of the invention includes Mo, and one or more metals selected from the group consisting of W, Co, Ti, Zr and Ta, in the form of an alloy, oxide, nitride or oxynitride, it can compensate the problems of decrease in adhesion force, and the like, which may be generated in case a transition metal such as Mo is included alone, thus exhibiting more excellent anti-oxidation effect, and it can stably maintain the shape of the layer even at a high temperature, thus effectively preventing the deformation of a thermoelectric element. Specifically, in the total transition metals constituting the anti-oxidation layer, Mo may be included in the amount of 10 to 90 atom %, more specifically, in the amount of 30 to 85 atom %.

More specifically, in case the anti-oxidation layer (400) includes an alloy component of molybdenum and one or more metals selected from the above described metal elements, Mo—Ti-based alloy, Mo—W-based alloy, Mo—Zr-based alloy, Mo—Ta-based alloy, Mo—Ti—Ta-based alloy, Mo—Ti—Co-based alloy, or Mo—Co—W-based alloy, and the like may be mentioned, and among them, Mo—Ti-based alloy that has excellent adhesive force with an element, and can exhibit excellent anti-oxidation effect, may be preferably included. In this case, based on the total weight of the anti-oxidation layer, the contents of Mo and Ti may be about 90 wt % or more, preferably about 95 wt % or more, or about 99 to about 100 wt %. And, within the above described content range, the Mo—Ti-based alloy may comprise Mo and Ti at the atomic ratio of 1:9 to 9:1, more specifically, at the atomic ratio of 5:1 to 3:7. Even more specifically, the alloy may comprise Mo and Ti at the atomic ratio of 4:1 to 1:1, and furthermore, when the alloy comprises Mo in an excessive amount compared to Ti, at the atomic ratio of 7:3 to 6:4, diffusion preventing property and durability can be exhibited as well as excellent high temperature stability.

And, in case the anti-oxidation layer (400) includes the compounds of the alloy, it may include the nitride, oxide or oxynitride of the above described alloys. Specifically, as the nitride, nitride including Mo—Ti (MoTiN) or oxynitride including Mo—Ti (MoTiON), nitride including Mo—Ta (MoTaN), and the like; as the oxide, oxide including Mo—Cu—W, and the like; and as the oxynitride, oxynitride including Mo—Ti (MoTiON), and the like may be mentioned, and mixtures thereof may be included. Among them, it may be preferable that nitride including Mo—Ti (MoTiN) or oxynitride including Mo—Ti (MoTiON) is included, and oxynitride including Mo—Ti, which not only has excellent heat stability, but also exhibits excellent adhesion property, may be more preferable. Here, the Mo and Ti may be included in the nitride and oxynitride at the atomic ratio described above in the Mo—Ti-based alloy. And, in this case, the anti-oxidation layer may include the compounds of alloy described above, in the content of about 90 wt % or more, preferably about 95 wt % or more, or about 99 wt % or more, based on the total weight of the anti-oxidation layer.

The thickness of the anti-oxidation layer (400) may be about 0.1 μm to about 200 μm, more specifically about 0.2 μm to about 100 μm. When the anti-oxidation layer is formed with the above thickness range, it may exhibit excellent adhesive force and anti-oxidation effect without deterioration of the shape and performance of a thermoelectric element.

Such an anti-oxidation layer (400) may be formed in direct contact with the thermoelectric element, in the form of a sputtered layer, a vapor-deposited layer, an ion-plated layer, an electroplated layer, or a sintered layer. For example, in case alloy is used as the anti-oxidation layer, it may be applied in the form of a sputtered layer, an electroplated layer, or a sintered layer, and in case the oxide, nitride or oxynitride of alloy is used as the anti-oxidation layer, it may be applied in the form of deposited layer such as a sputtered layer, a vapor-deposited layer, or an ion-plated layer, and the like.

In case alloy is applied in the form of a sintered layer, each metal component included in corresponding alloy may be prepared in the form of powder, and a paste composition is prepared by mixing them with a binder or a solvent, and the like, and then, it may be coated on the surface of a thermoelectric element, and sintered.

In case a sputtering method is applied, first, an oxidation layer may be removed on the surface to be deposited by plasma treatment, and sputtering may be progressed at about 0.1 to about 50 W/cm$^2$, using sputtering equipment. The deposition time may vary according to the surface to be deposited or elements deposited, but for example, it may be progressed for about 1 to about 60 minutes, and the operation pressure may be about 0.1 to about 50 mTorr. And, in case the anti-oxidation layer includes nitride of alloy, sputtering may be conducted while introducing nitrogen. Such a sputtering method may be usefully applied, particularly in case oxide, nitride or oxynitride of alloy is formed with a thickness of about 100 μm or less.

And, in case an ion plating method is applied, ion plating equipment may be preheated under a vacuum state, and glow discharge may be progressed, and then, remaining gas may be ionized in a vacuum, thus progressing deposition by ion bombardment. For example, it is preferable that the vacuum state is maintained at a level of about $1 \times 10^{\wedge}(-4)$ to about $1 \times 10^{\wedge}(-5)$ mbar, and after preheating to about 300° C., glow discharge may be progressed by Ar ions, and the like, at a level of about 50 W to 70 W, for about 10 minutes to about 30 minutes. It may be preferable that the ion bombardment is progressed at the level of about 1 to about 5 kW for about 30 minutes or less, and deposition is progressed at the level of about 1 to about 5 kW for about 30 minutes to about 3 hours. Such an ion plating method may be usefully applied, particularly in case the deposition thickness is about 100 μm or less.

Besides, specific processes of each method for the deposition of metals or metal compounds are not specifically limited as long as they are commonly used in the field to which the present invention pertains.

Such an anti-oxidation layer (400), even when exposed to a high temperature condition, specifically, about 200° C. to about 600° C. for about 72 hours or more, or about 100 hours or more, it can prevent a surface oxidation reaction of a thermoelectric element without generating leakage of metal elements, thus increasing high temperature stability.

Meanwhile, in the thermoelectric module according to one embodiment of the present invention, the thermoelectric elements (100) are divided into a p-type thermoelectric element and an n-type thermoelectric element according to the function, and one pair of alternating p-n thermoelectric elements become a basic unit.

The thermoelectric element (100) comprises thermoelectric semiconductor. The kind of the thermoelectric semiconductor is not specifically limited, and specifically, it may include Bi—Te, skutterudite, silicide, Half heusler, Co—Sb, PbTe, Si, and SiGe-based thermoelectric semiconductors, etc. Among them, Bi—Te-based or Co—Sb-based thermoelectric semiconductor can exhibit more excellent improvement effect when used together with the above described anti-oxidation layer, and thus, is preferable.

And in the thermoelectric module according to one embodiment of the present invention, the electrodes (200) are for the connection between the plural thermoelectric elements, specifically, for the electrical series connection between a p-type thermoelectric element and an n-type thermoelectric element, and they are positioned on the upper side and the lower side, respectively, and may comprise conductive material. The conductive material is not specifically limited, and specifically, it may include Cu, Cu—Mo, Ag, Au or Pt, etc., and a mixture thereof may be used. Among them, the electrode may comprise Cu or Ag having high electric conductivity and thermal conductivity.

And, in the thermoelectric module according to one embodiment of the present invention, a joining layer (300) for joining the thermoelectric element and electrode is positioned between each thermoelectric element (100) and electrode (200).

The joining layer (300) may be a soldered metal layer, or a sintered metal layer. Specifically, the joining layer for joining a thermoelectric element and an electrode may be formed by coating a metal paste for the formation of a joining layer on each barrier layer, and positioning an electrode thereon, and then, progressing soldering or sintering. More specifically, it may be formed by a soldering method wherein metal is molten and joined using a solder paste such as a Sn-based solder paste or a Pb-based solder paste, and the like, or it may be formed by positioning a metal paste for the formation of a joining layer prepared by mixing one or more metal powders selected from nickel (Ni), copper (Cu), ferrous (Fe), silver (Ag), or tin (Sn), and the like, selectively with a binder, a dispersant and a solvent, between a thermoelectric element and an electrode, and progressing sintering.

When the joining layer is formed by transient liquid phase sintering (TLPS), an intermetallic compound consisting of different kinds of metals may be produced, and it may be sintered to form a joining layer.

Particularly, even if a metal paste having a similar composition is used, a sintered density may vary according to the conditions of metal dispersion and mixing, and as the uniform dispersion and mixing of metal particles are achieved in the metal paste, an intermetallic compound with a high sintered density may be formed, and the sintered joining layer may have excellent joining property.

And, in case the joining layer (300) is formed of a sintered metal layer, the sintered metal layer may include one or more first metals selected from the group consisting of Ni, Cu, Fe, and Ag; and one or more second metals selected from the group consisting of tin (Sn), zinc (Zn), bismuth (Bi) and indium (In), and more specifically, it may include the first metal and the second metal at a weight ratio of 95:5 to 70:30.

Specifically, the first metal is a high melting point metal having a melting point of about 900° 0 or more, the second metal is a low melting point metal having a melting point of about 500° C. or less, and the joining layer included in the thermoelectric module of the present invention may be formed by the sintering of a metal paste including each metal powder. Namely, since the metal paste for the formation of a joining layer include both high melting point metal powder and low melting point metal powder, the joining layer may be formed according to the sintering of an intermetallic compound even at a relatively low temperature.

More specifically, under conditions above the melting point of the second powder, the flowability of the second metal becomes smooth, and thus, diffusivities of the first and the second metals significantly increase, thereby facilitating the formation of an intermetallic compound by the intermetallic reaction between both metal powders, and a sintering reaction. The intermetallic compound joining layer produced through the process may have high electric conductivity and thermal conductivity due to the properties of the first and the second metals, and have high heat resistance due to the property of the first metal, thus performing a function as a joining layer for stably joining a thermoelectric element and an electrode even at a high temperature.

And, the joining layer (300) may consist of a single phase of the intermetallic compound produced by the sintering of the paste, or a mixed phase of the intermetallic compound and the first and the second metals, and the rate of the single phase of the intermetallic compound in the joining layer may be 90 wt % or more.

The first metal and the second metal may be included at a weight ratio of about 99:1 to about 50:50, preferably about 99:1 to about 60:40 or about 95:5 to about 70:30.

And, the thickness of the joining layer (300) may be about 0.05 μm to about 200 μm. If the thickness is thinner than the above range, it may be difficult to overcome a height deviation of thermoelectric legs, and if it is thicker than the above range, problems may be generated in terms of conductivity and alignment of legs.

And, the joining layer (300) may be a porous sintered joining layer formed by sintering of the above described metal elements, and specifically, the porosity may be preferably about 10% or less, or about 0.01 to about 10%, or about 0.1 to 5%.

Here, the porosity is a rate occupied by pores to the total area of the joining layer, measured by observing the cross section of the joining layer, using equipment such as SEM, TEM, and the like. Since the joining layer exhibits low porosity of about 10% or less, excellent mechanical joining force and high temperature reliability may be expected.

The joining layer (300) may have a joining strength of about 1 MPa or more, preferably about 1 MPa to about 20 MPa, or about 10 MPa to about 20 MPa.

Here, the joining strength is a shear strength at the moment when an element is fractured at an electrode by the application of a shear force to a thermoelectric element, measured using a bondtester (Nordson DAGE 4000).

And, the thermoelectric module according to one embodiment of the present invention may further comprise a structure corresponding to the structure shown in FIG. 1, specifically, an anti-oxidation layer (not shown), a joining layer (not shown) and an electrode (200), formed on a side opposite to the side of the thermoelectric element (100) on which the anti-oxidation layer (400) is formed.

Meanwhile, the thermoelectric module having the above described structure may be prepared by respectively forming anti-oxidation layers on the upper side and the lower side of the thermoelectric element (step 1); and positioning a metal paste for the formation of a joining layer on each anti-oxidation layer, and then, contacting an electrode, or positioning a metal paste for the formation of a joining layer on an electrode, and then, contacting the anti-oxidation layers to join (step 2). Thus, according to yet another embodiment of the present invention, a method for preparing the above described thermoelectric module is provided.

Specifically, the step 1 is a step of forming an anti-oxidation layer on a thermoelectric element.

The step of forming an anti-oxidation layer may be conducted by respectively forming anti-oxidation layers on the upper side and the lower side of a thermoelectric element, by PVD (physical vapor deposition) such as sputtering, evaporation or ion plating; plating; or sintering, and the like, using Mo metal powder and one or more metal powders selected from the group consisting of W, Co, Ti, Zr and Ta, or using alloy including Mo and one or more metals selected from the group consisting of W, Co, Ti, Zr and Ta.

The thermoelectric element is as explained above. However, in order to form the anti-oxidation layer, the thermoelectric element may be subjected to pre-treatment for controlling the impurities and the oxidation film formed on the surface of the thermoelectric. Specifically, the pre-treatment may be conducted by surface sputtering with argon ion.

Meanwhile, the metal paste for the formation of a joining layer may comprise one or more first metal powders selected from the group consisting of Ni, Cu, Fe and Ag; and one or more second metal powders selected from the group consisting of Sn, Zn, Bi and In, and selectively, it may further comprise a binder, a dispersant, and a solvent.

Here, the first metal and the second metal may be included at a weight ratio of about 99:1 to about 50:50, preferably about 99:1 to about 60:40 or about 95:5 to about 70:30.

And, the first metal and the second metal may be in the form of powders having an average particle diameter of 10 μm or less, preferably 0.3 to 3 μm. If the average particle diameter of the first and the second metal powders are within the above ranges, the oxidation degree of metal powders may be lowered, and a reaction for the formation of an intermetallic compound and a sintering degree may be improved by an appropriate specific surface area.

The dispersant performs a function for improving the dispersibility of the first and the second metal powders in a solvent, in a metal paste without binder resin, and it may exist while being adsorbed on the surfaces of the first metal powder and the second metal powder.

Such a dispersant may be aliphatic acid having 12 to 20 carbon atoms, or an alkali metal salt or an alkali earth metal salt thereof, more specifically, stearic acid, oleic acid, oleylamine, palmitic acid, dodecanoic acid, isostearic acid, sodium stearate, or sodium dodecanoate, and the like.

And, the dispersant may be included in the content of about 0.1 to about 5 wt %, preferably about 0.5 to about 1.5 wt %, based on the total weight of the metal paste.

The solvent affords wettability to the metal paste, and functions as a vehicle carrying the first, second metal powders, and particularly, it can conduct a drying process and a joining process at a low temperature less than 350° C. because it has a boiling point of 150 to 350° C.

And, the solvent may include one selected from the group consisting of alcohols, carbonates, acetates, and polyols, and more specifically, it may be dodecanol, propylene carbonate, diethylene glycol mono ethyl acetate, tetrahydrofurfuryl alcohol, terpineol, dihydroterpineol, ethylene glycol, glycerin, tridecanol or isotridecanol, and the like.

And, the metal paste may further comprise sintering-inducing additives.

The sintering-inducing additives perform a function for reducing an oxidation layer on the metal surface in the paste so as to induce and facilitate the production and sintering of an intermetallic compound, inducing the initiation of a synthesis reaction, or assisting in the thermal decomposition of a carbon-based dispersant, and a metal paste comprising the same may form a denser joining layer even under the same joining conditions.

And, the sintering-inducing additives may be included in the content of about 2 to about 20 wt %, preferably about 5 to about 10 wt %, based on the total weight of the metal paste.

As a method of coating the metal paste on an electrode, various methods for coating a solder paste, and the like, commonly used in the technical field to which the present invention pertains, may be used, and for example, it may be preferable that a coating region is exactly controlled by stencil printing, and the like.

And, the joining step may comprise pressurized sintering at a temperature of about 200° C. to about 400° C. and a pressure of about 0.1 MPa to about 200 MPa. Here, the sintering step may be a pressurized sintering method well known to a person having ordinary knowledge in the art, the pressure and the temperature are not necessarily limited to the above ranges, and specifically, it may be preferably conducted at a temperature above the melting point of metal powder selected.

Hereinafter, the actions and the effects of the invention will be explained in detail through specific examples of the invention. However, these examples are presented only as the illustrations of the invention, and the scope of the right of the invention is not determined thereby,

EXAMPLE

Example 1

(1) 78.0 wt % of Ag powder (average particle diameter: 300 nm), 5.0 wt % of Sn powder (average particle diameter: 1 μm), 2.1 wt % of methyl methacrylate (MMA) as a binder, 0.5 wt % of sodium stearate as an additive, and the remaining amount of a solvent of isophorone were mixed to prepare a metal paste (100 wt %).

On a DBC (Direct Bonded Copper) substrate capable of functioning as an electrode connecting thermoelectric elements, the metal paste prepared in (1) was coated by stencil printing, and dried at 110° C. for 10 minutes.

(2) A wafer was prepared using thermoelectric material of P-type $Bi_{0.5}Sb_{1.5}Te_3$ N-type $Bi_2Te_{2.7}Se_{0.3}$ composition, which is Bi—Te-based thermoelectric semiconductor, and a Mo—Ti alloy layer was deposited thereon as an anti-oxidation layer. At this time, the deposition was progressed using sputtering equipment, under conditions of 4.4 W/cm$^2$ and a process pressure of 30 mTorr, and the Mo—Ti alloy in the alloy layer has the atomic ratio of Mo:Ti of 62:38.

Thereafter, it was diced to a size of 3×3 mm$^2$ to prepare thermoelectric legs.

(3) The DBC substrate on which the metal paste was coated and dried, and the thermoelectric leg on which the anti-oxidation layer was formed were pressurized (5 MPa) at 300° C. for 10 minutes, while the anti-oxidation layer and the metal paste-coated side were made to be in contact, thus manufacturing a thermoelectric module by pressurized sintering and joining.

The size of the high temperature region substrate of the manufactured thermoelectric module was 30×30 mm$^2$, the size of the low temperature region substrate was 30×32 mm$^2$, and the size of the element was 3×3×2 mm$^3$, and the thermoelectric module includes 32 pairs.

The thickness of the joining layer was confirmed to be 100 nm, and the thickness of the anti-oxidation layer was confirmed to be about 400 nm.

Example 2

A thermoelectric module was manufactured by deposition of a Mo—Ti alloy layer by the same method as Example 1, except that a wafer was prepared using thermoelectric material of $In_{0.2}Co_4Sb_{12}$, which is skutterudite (Co—Sb-based) thermoelectric semiconductor.

The thickness of the anti-oxidation layer was confirmed to be about 400 nm.

Example 3

A thermoelectric module was manufactured by the same method as Example 1, except that a wafer was prepared using thermoelectric material of $In_{0.2}Co_4Sb_{12}$, which is skutterudite (Co—Sb-based) thermoelectric semiconductor, and an anti-oxidation layer was formed by deposition of MoTiON (Mo:Ti=50:50 atomic ratio), using MoTi alloy (Mo:Ti=50:50 atomic ratio) target and sputtering equipment, under conditions of 4.4 W/cm$^2$, a process pressure of 6 mTorr, 3 sccm, and nitrogen 20 sccm.

The thickness of the anti-oxidation layer was confirmed to be about 400 nm.

Comparative Example 1

An anti-oxidation layer of a four-layer structure was formed by preparing a wafer using thermoelectric material of $In_{0.2}Co_4Sb_{12}$, which is skutterudite (Co—Sb-based) thermoelectric semiconductor, and sequentially depositing a titanium layer, a molybdenum layer, a titanium layer and a molybdenum layer on the thermoelectric semiconductor layer. Wherein, the deposition of each metal layer was progressed using sputtering equipment, under conditions of 2-3 W/cm$^2$, and a process pressure of 0.5-3 mTorr, and it was conducted such that the thickness of each metal layer in the anti-oxidation layer was identical. Besides, it was conducted by the same method as Example 1, to manufacture a thermoelectric module.

The thickness of the anti-oxidation layer was confirmed to be about 270 nm.

Comparative Example 2

A thermoelectric module was prepared by the same method as Comparative Example 1, except that the anti-oxidation layer of a four-layer structure of a titanium layer/a molybdenum layer/a titanium layer/a molybdenum layer was deposited and formed to a thickness of about 400 nm in Comparative Example 1.

Experimental Example

In order to evaluate the influence of the formation of an anti-oxidation layer on the heat stability of a thermoelectric element, anti-oxidation layers were formed on thermoelectric elements, respectively by the same methods as Examples 1 to 3, and Comparative Examples 1 to 2.

Subsequently, the thermoelectric element on which the anti-oxidation layer was formed was exposed to the temperature condition described in the following Table 1 for 72 hours, to evaluate whether or not the thermoelectric element or the anti-oxidation layer was deformed.

Specifically, after the thermal evaluation, it was confirmed whether or not the anti-oxidation layer was deformed and the thermoelectric element was deformed, by observing the cross section of the thermoelectric element with a transmission electron microscope (TEM). And, it was confirmed whether or not a compound peak was formed through X-ray diffraction (XRD) analysis, and thereby, it was confirmed whether or not elements were inflowed. The results are respectively shown in the following Table 1 and FIGS. 2A to 3D.

Figure 2A:
FIG. 2A and FIG. 2B are respectively, images observing the cross sections of thermoelectric elements having anti-oxidation layers according to Examples 2 and 3 with a transmission electron microscope (TEM)
Figure 2B:
Figure 2C:
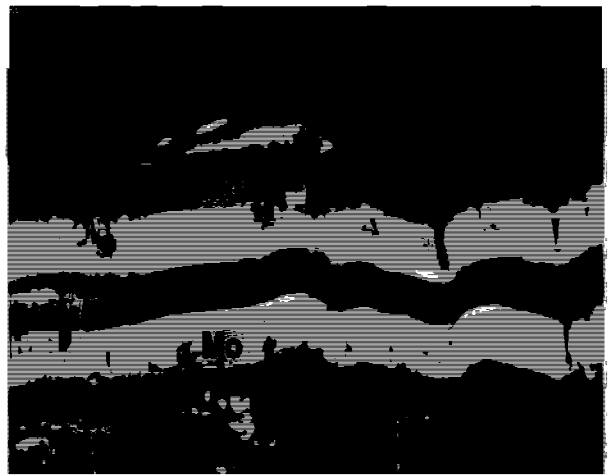
FIG. 2C and FIG. 2D are images observing the cross section of a thermoelectric element having a multi-layered anti-oxidation layer according to Comparative Example 1, at different locations, with a transmission electron microscope(TEM)
Figure 2C:
Figure 2D:
Figure 2D:
Figure 2E:
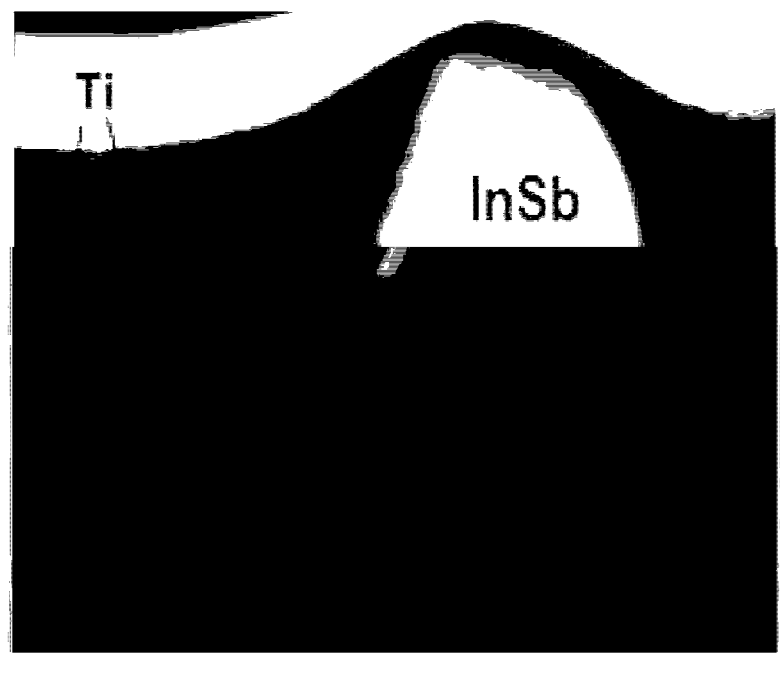
FIG. 2E is an image observing the cross section of a thermoelectric element having a multi-layered anti-oxidation layer according to Comparative Example 2, with a TEM (the measurement magnification of FIGS. 2A to 2C: respectively ×40000, the measurement magnification of FIG. 2D: ×57000, the measurement magnification of FIG. 2E: ×20000).

FIG. 2A and FIG. 2B are respectively, the images observing the cross sections of the thermoelectric elements on which the anti-oxidation layers according to Examples 2 and 3 were formed, with a transmission electron microscope (TEM) (measurement magnification of FIG. 2A and FIG. 2B: respectively ×40000), and FIG. 2C and FIG. 2D are the images observing the cross section of the thermoelectric element on which the multilayered anti-oxidation layer according to Comparative Example 1 was formed, at different locations, with a transmission electron microscope (TEM) (measurement magnification of FIG. 2C: ×40000. measurement magnification of FIG. 2D: ×57000). And, FIG. 2E is the image observing the cross section of the thermoelectric element on which the multilayered anti-oxidation layer according to Comparative Example 2 was formed, with a transmission electron microscope(TEM) (measurement magnification of FIG. 2E: ×20000)

Figure 3A:
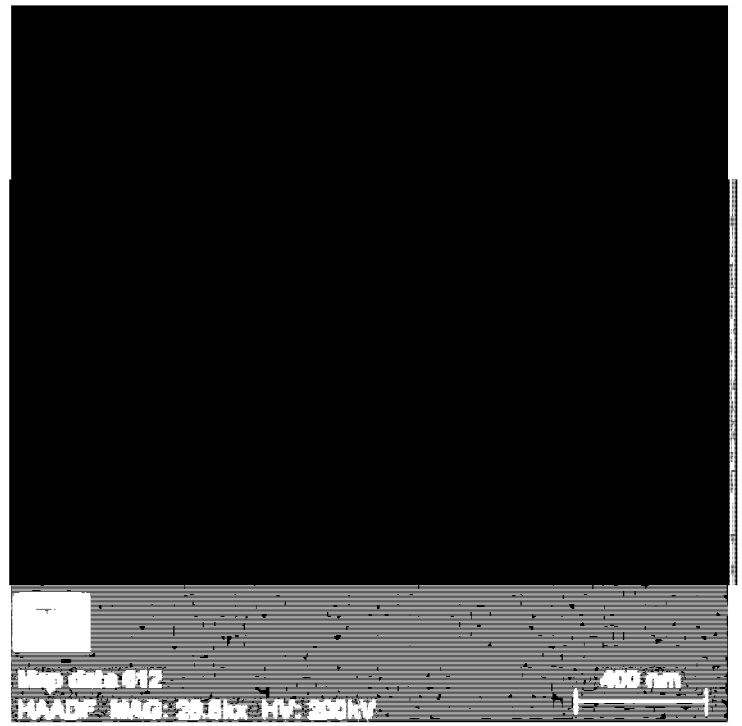
FIG. 3A and FIG. 3B are respectively, an image of elementary analysis of the cross sections of thermoelectric elements having anti-oxidation layers according to Examples 2 and 3, through a transmission electron microscope(TEM)
Figure 3B:
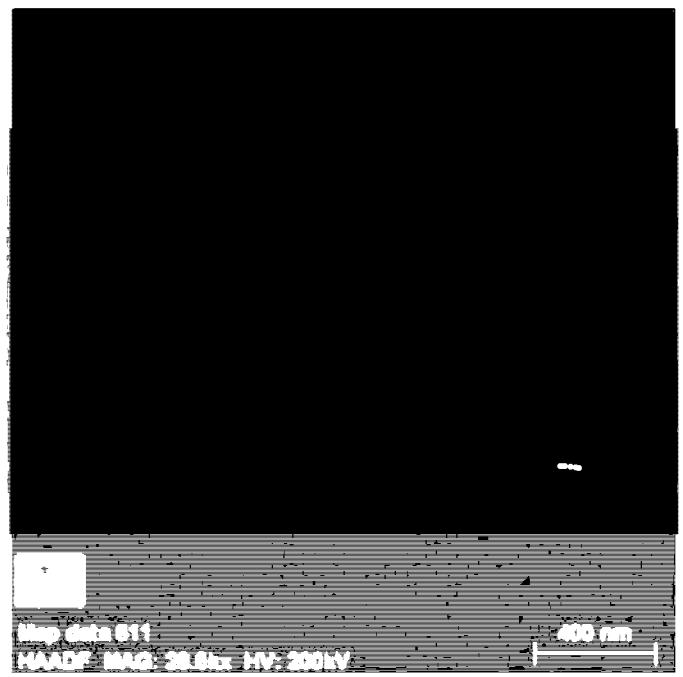
Figure 3C:
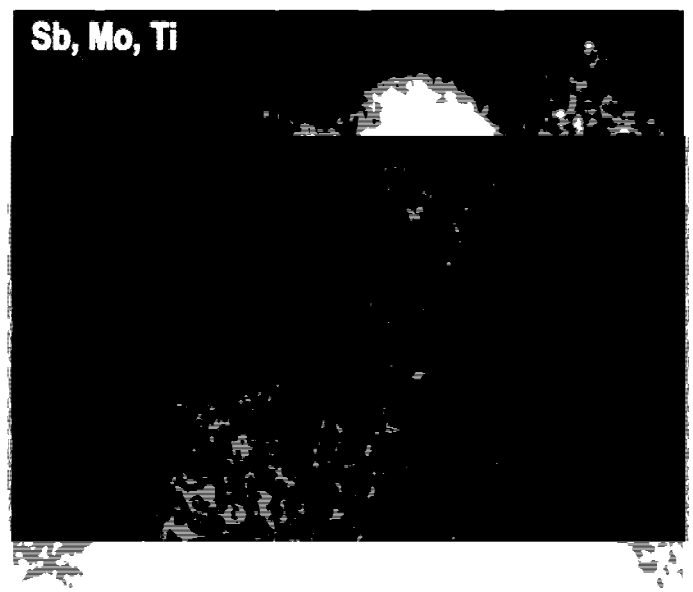
FIG. 3C and FIG. 3D are respectively, an image of elementary analysis of the cross sections of thermoelectric elements having multi-layered anti-oxidation layers according to Comparative Examples 1 and 2, through a TEM (the measurement magnification of FIG. 3A and FIG. 3B: respectively ×28500, the measurement magnification of FIG. 3C: ×57000, the measurement magnification of FIG. 3D: ×10000).
Figure 3D:
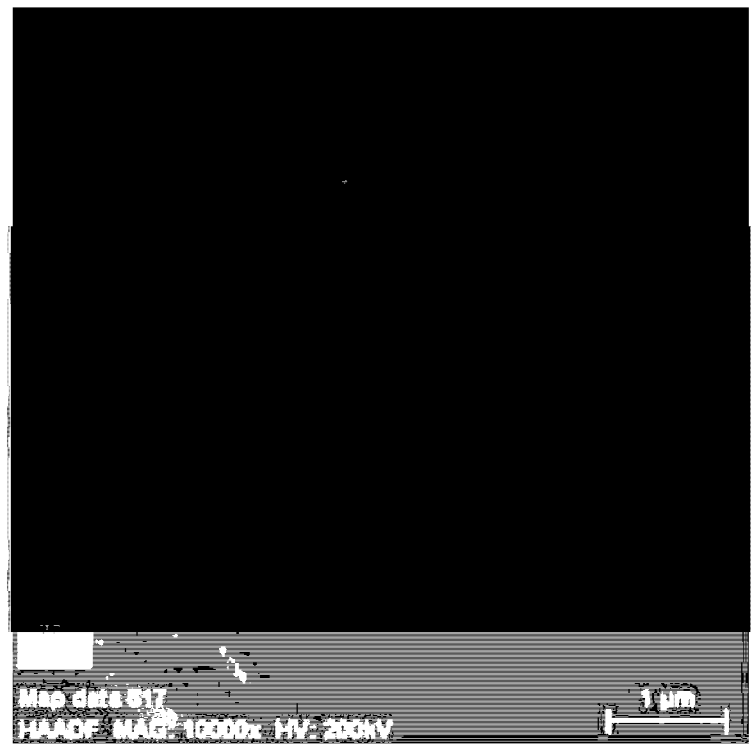

And, FIG. 3A and FIG. 3B are respectively, the images of the elementary analysis of the cross sections of the thermoelectric elements on which the anti-oxidation layers according to Examples 2 and 3 were formed, through a transmission electron microscope(TEM) (measurement magnifications of FIG. 3A and FIG. 3B: respectively, ×28500), and FIG. 3C and FIG. 3D are respectively, the images of the elementary analysis of the cross sections of the thermoelectric elements on which the multilayered anti-oxidation layers according to Comparative Examples 1 and 2 were formed, through a transmission electron microscope (TEM) (measurement magnifications of FIG. 3C: ×57000, measurement magnification of FIG. 3D: respectively, ×10000)

TABLE 1

| | Material of anti-oxidation layer | thickness (nm) | temperature (° C.) | Exposure time (H) | Deformation of element | Deformation of anti-oxidation layer |
|---|---|---|---|---|---|---|
| Example 1 | MoTi | about 400 | 300 | 72 | Not deformed | Not deformed |
| Example 2 | MoTi | about 400 | 500 | 72 | Not deformed | Not deformed |
| Example 3 | MoTiON | about 400 | 500 | 72 | Not deformed | Not deformed |
| Comparative Example 1 | Ti/Mo/Ti/Mo | about 270 | 500 | 72 | Mo and Ti elements inflowed | fracture generated |
| Comparative Example 2 | Ti/Mo/Ti/Mo | about 400 | 500 | 72 | Mo and Ti elements inflowed | fracture generated |

Referring to Table 1 and FIGS. 2A to 3D, it can be confirmed that in the case of a thermoelectric element on which an anti-oxidation layer is formed as in Examples 1 to 3 of the present invention, even if exposed to a high temperature condition for a long time, deformation of the anti-oxidation layer or the thermoelectric element itself was not generated at all, and particularly, the shape of the layer was maintained as it is.

To the contrary, it can be seen that in the case of a thermoelectric element on which a multilayered anti-oxidation layer is formed as in Comparative Examples 1 and 2, metal was molten under a high temperature condition to generate fracture in the middle of the anti-oxidation layer, and thus, a metal element was leaked into the thermoelectric element, thus generating deformation of the thermoelectric element. Particularly, referring to FIG. 3C and FIG. 3D, it can be clearly confirmed that fracture was generated in a molybdenum layer, and a titanium component was eluted outside the layer and diffused toward the thermoelectric element.

Referring to the above results, it can be seen that the thermoelectric module according to the embodiments of the present invention has very excellent high temperature stability, and thus, can be stably operated for a long time, even under a high temperature environment where a temperature difference between a low temperature region and a high temperature region is increased so as to increase the efficiency.

The invention claimed is:

1. A thermoelectric module comprising:
A) at least a first and a second thermoelectric element, the first and second thermoelectric elements comprising a thermoelectric semiconductor;
B) an electrode connecting the first and second thermoelectric elements;
C) at least a first and a second joining layers, the first joining layer positioned between the first thermoelectric element and the electrode and the second joining layer positioned between the second thermoelectric element and the electrode; and
D) at least a first and a second anti-oxidation layers, the first anti oxidation layer positioned between the first thermoelectric element and the first joining layer, and the second anti-oxidation layer positioned between the second thermoelectric element and the second joining layer,
wherein the first and second anti-oxidation layers independently comprise an oxynitride of an alloy comprising molybdenum and titanium.

2. The thermoelectric module according to claim 1, wherein a thickness of the first and second anti-oxidation layers is 0.1 to 200 μm.

3. The thermoelectric module according to claim 1, wherein the alloy comprises molybdenum and titanium at an atomic ratio of 5:1 to 3:7.

4. The thermoelectric module according to claim 1, wherein the first and second anti-oxidation layers are each a sputtered layer, a vapor-deposited layer, an ion-plated layer, an electroplated layer, or a sintered layer.

5. The thermoelectric module according to claim 1, wherein the first and second anti-oxidation layers are each formed by direct contact to the first and second thermoelectric element, respectively.

6. The thermoelectric module according to claim 1, wherein the first and second joining layers are each a soldered metal layer or sintered metal layer.

7. The thermoelectric module according to claim 6, wherein the first and second joining layers are each the sintered metal layer, which comprises one or more first metal selected from the group consisting of nickel (Ni), copper (Cu), iron (Fe), and silver (Ag); and one or more second metal selected from the group consisting of tin (Sn), zinc (Zn), bismuth (Bi) and indium (In).

8. The thermoelectric module according to claim 1, wherein the thermoelectric semiconductor comprises a Co—Sb-based thermoelectric semiconductor, or a Bi—Te-based thermoelectric semiconductor.

* * * * *